(12) United States Patent
Illek et al.

(10) Patent No.: US 8,536,603 B2
(45) Date of Patent: Sep. 17, 2013

(54) OPTOELECTRONIC SEMICONDUCTOR CHIP AND METHOD OF PRODUCING AN OPTOELECTRONIC SEMICONDUCTOR CHIP

(75) Inventors: Stefan Illek, Donaustauf (DE); Uwe Strauss, Bad Abbach (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/123,779

(22) PCT Filed: Oct. 12, 2009

(86) PCT No.: PCT/DE2009/001416
§ 371 (c)(1),
(2), (4) Date: May 10, 2011

(87) PCT Pub. No.: WO2010/048918
PCT Pub. Date: May 6, 2010

(65) Prior Publication Data
US 2011/0235664 A1  Sep. 29, 2011

(30) Foreign Application Priority Data

Oct. 31, 2008 (DE) .......................... 10 2008 054 217

(51) Int. Cl.
*H01L 33/00* (2010.01)
(52) U.S. Cl.
USPC .............. 257/98; 257/99; 257/100; 257/102; 257/E33.06; 438/29; 438/30; 438/31; 438/32; 438/33
(58) Field of Classification Search
USPC .................. 438/29–35; 257/98–102, E33.06
See application file for complete search history.

(56) References Cited

U.S. PATENT DOCUMENTS

| | | | | |
|---|---|---|---|---|
| 4,716,132 A | * | 12/1987 | Hirata | 438/32 |
| 5,070,509 A | * | 12/1991 | Meyers | 372/45.01 |
| 5,177,758 A | * | 1/1993 | Oka et al. | 372/50.11 |
| 5,206,877 A | * | 4/1993 | Kahen | 372/96 |
| 5,274,660 A | * | 12/1993 | Abe | 372/96 |
| 5,659,562 A | * | 8/1997 | Hisa | 372/96 |
| 5,852,625 A | * | 12/1998 | Takahashi | 372/96 |
| 5,953,361 A | * | 9/1999 | Borchert et al. | 372/96 |
| 6,104,739 A | * | 8/2000 | Hong et al. | 372/50.11 |
| 6,327,413 B1 | * | 12/2001 | Kinoshita | 385/129 |
| 6,350,997 B1 | | 2/2002 | Saeki | |
| 6,365,428 B1 | * | 4/2002 | Zubrzycki et al. | 438/32 |
| 6,455,338 B1 | * | 9/2002 | Takagi et al. | 438/24 |

(Continued)

FOREIGN PATENT DOCUMENTS

| | | | |
|---|---|---|---|
| DE | 10 2006 024 220 A1 | 10/2007 | |
| EP | 1 879 272 A1 | 1/2008 | |
| WO | 96/41402 A1 | 12/1996 | |

*Primary Examiner* — N Drew Richards
*Assistant Examiner* — Ankush Singal
(74) *Attorney, Agent, or Firm* — DLA Piper LLP (US)

(57) ABSTRACT

An optoelectronic semiconductor chip having a semiconductor layer sequence with a plurality of layers arranged over one another includes an active layer with an active region which emits electromagnetic radiation in an emission direction when in operation, a first grating layer on the active layer which, in an emission direction, has a plurality of stripes in the form of grating lines extending perpendicularly to the emission direction with spaces arranged therebetween, and a second grating layer on the first grating layer which covers the stripes of the first grating layer and the spaces and which comprises a transparent material applied by non-epitaxial application.

17 Claims, 4 Drawing Sheets

(56) References Cited

U.S. PATENT DOCUMENTS

| | | | |
|---|---|---|---|
| 6,608,855 B1* | 8/2003 | Hwang et al. | 372/96 |
| 6,638,773 B1* | 10/2003 | Hwang et al. | 438/2 |
| 6,893,891 B2* | 5/2005 | Nesnidal et al. | 438/32 |
| 7,065,123 B2* | 6/2006 | Mori et al. | 372/96 |
| 7,095,058 B2* | 8/2006 | Gardner | 257/98 |
| 7,502,402 B2* | 3/2009 | Miyazaki | 372/50.22 |
| 7,583,719 B2* | 9/2009 | Makino | 372/102 |
| 7,680,371 B2* | 3/2010 | Cheben et al. | 385/28 |
| 7,851,240 B2* | 12/2010 | Yanagisawa | 438/29 |
| 7,855,093 B2* | 12/2010 | Okamoto et al. | 438/32 |
| 2001/0046246 A1* | 11/2001 | Watanabe et al. | 372/45 |
| 2002/0048300 A1* | 4/2002 | Tsukiji et al. | 372/43 |
| 2002/0064203 A1* | 5/2002 | Pezeshki et al. | 372/64 |
| 2002/0101896 A1* | 8/2002 | Funabashi et al. | 372/45 |
| 2003/0091081 A1* | 5/2003 | Sahara et al. | 372/45 |
| 2003/0147617 A1* | 8/2003 | Park et al. | 385/131 |
| 2003/0210723 A1* | 11/2003 | Adams et al. | 372/50 |
| 2004/0135166 A1 | 7/2004 | Yamada et al. | |
| 2004/0165637 A1 | 8/2004 | Bullington et al. | |
| 2004/0183087 A1* | 9/2004 | Gardner | 257/102 |
| 2004/0218850 A1* | 11/2004 | Peters | 385/14 |
| 2005/0224832 A1* | 10/2005 | Wu et al. | 257/103 |
| 2006/0062270 A1* | 3/2006 | Okutani et al. | 372/64 |
| 2006/0071233 A1* | 4/2006 | Cho et al. | 257/103 |
| 2006/0192483 A1* | 8/2006 | Nakanishi et al. | 313/504 |
| 2007/0091951 A1* | 4/2007 | Bour et al. | 372/43.01 |
| 2007/0280318 A1* | 12/2007 | Yoshimoto et al. | 372/43.01 |
| 2008/0095207 A1* | 4/2008 | Nomaguchi | 372/50.11 |
| 2008/0165818 A1* | 7/2008 | Hashimoto | 372/43.01 |
| 2008/0169479 A1* | 7/2008 | Xu et al. | 257/94 |
| 2008/0212637 A1* | 9/2008 | Makino | 372/50.11 |
| 2008/0261157 A1* | 10/2008 | Lee et al. | 430/314 |
| 2009/0047751 A1* | 2/2009 | Yoshimoto et al. | 438/32 |
| 2009/0080482 A1* | 3/2009 | Makino | 372/45.01 |
| 2009/0086785 A1* | 4/2009 | Hatori et al. | 372/50.11 |
| 2009/0304039 A1 | 12/2009 | Lutgen et al. | |
| 2010/0081224 A1* | 4/2010 | Yanagisawa | 438/32 |
| 2010/0202487 A1* | 8/2010 | Sartorius et al. | 372/50.11 |

* cited by examiner

OPTOELECTRONIC SEMICONDUCTOR CHIP AND METHOD OF PRODUCING AN OPTOELECTRONIC SEMICONDUCTOR CHIP

RELATED APPLICATIONS

This is a §371 of International Application No. PCT/DE2009/001416, with an international filing date of Oct. 12, 2009 (WO 2010/048918 A1, published May 6, 2010), which is based on German Patent Application No. 10 2008 054 217.2, filed Oct. 31, 2008, the subject matter of which is incorporated by reference.

TECHNICAL FIELD

This disclosure relates to an optoelectronic semiconductor chip and a method of producing an optoelectronic semiconductor chip.

BACKGROUND

For many semiconductor laser applications it is necessary for the emission spectrum to have the smallest possible spectral width, longitudinal single-modality and a readily controlable wavelength temperature sensitivity.

It could therefore be helpful to provide an optoelectronic semiconductor chip with a semiconductor layer sequence with a plurality of layers arranged one over the other. It could also be helpful to provide a method of producing such an optoelectronic semiconductor chip.

SUMMARY

We provide an optoelectronic semiconductor chip having a semiconductor layer sequence with a plurality of layers arranged over one another, including an active layer with an active region which emits electromagnetic radiation in an emission direction when in operation, a first grating layer on the active layer which, in an emission direction, has a plurality of stripes in the form of grating lines extending perpendicularly to the emission direction with spaces arranged therebetween, and a second grating layer on the first grating layer which covers the stripes of the first grating layer and the spaces and which includes a transparent material applied by non-epitaxial application.

We also provide a method of producing an optoelectronic semiconductor chip with a semiconductor layer sequence with a plurality of layers arranged one over the other, including providing an active layer with an active region which emits electromagnetic radiation in an emission direction when in operation, applying a first grating layer on the active layer which, in an emission direction, has a plurality of stripes in the form of grating lines extending perpendicularly to the emission direction with spaces arranged therebetween, and applying a second grating layer on the first grating layer which covers the stripes of the first grating layer and the spaces and which includes a transparent material applied by non-epitaxial application.

DETAILED DESCRIPTION

Figure 1A:
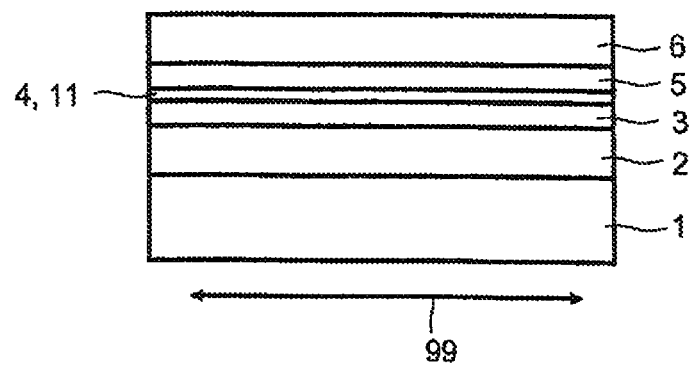
FIGS. 1A to 1E show schematic representations of one example of a method of producing an optoelectronic semiconductor chip.
Figure 1B:
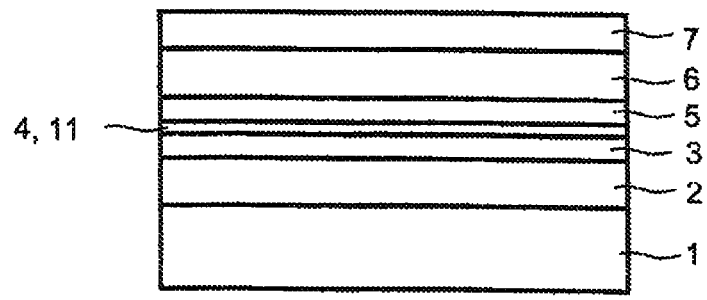

Our optoelectronic semiconductor chip may comprise in particular a semiconductor layer sequence with a plurality of layers arranged one over the other and include in particular:
  A) an active layer with an active region suitable for emitting electromagnetic radiation in an emission direction when in operation,
  B) a first grating layer on the active layer, which, in the emission direction, has a plurality of stripes in the form of grating lines extending perpendicularly to the emission direction with spaces arranged therebetween, and
  C) a second grating layer on the first grating layer, which covers the stripes of the first grating layer and the spaces and which comprises a transparent material, which is applied by a non-epitaxial application method.

Our method of producing an optoelectronic semiconductor chip with a semiconductor layer sequence with a plurality of layers arranged one over the other may comprises:
  A) providing an active layer with an active region suitable for emitting electromagnetic radiation in an emission direction when in operation,
  B) applying a first grating layer on the active layer which, in the emission direction, has a plurality of stripes in the form of grating lines extending perpendicularly to the emission direction with spaces arranged therebetween, and
  C) applying a second grating layer on the first grating layer, which covers the stripes of the first grating layer and the spaces and which comprises a transparent material, which is applied by a non-epitaxial application method.

The examples, features and combinations thereof described below likewise relate to the optoelectronic semiconductor chip and to the method of producing the optoelectronic semiconductor chip, unless explicitly stated otherwise.

Here and hereinafter "light" or "electromagnetic radiation" may likewise in particular mean electromagnetic radiation with at least one wavelength or one wavelength range from an infrared to ultraviolet wavelength range. In this respect, the light or the electromagnetic radiation may exhibit a visible, i.e., a near infrared to blue wavelength range with one or more wavelengths of between approximately 350 nm and approximately 1000 nm.

The statement that a layer or an element is arranged or applied "on" or "over" another layer or another element may here and hereinafter mean that the one layer or the one element is arranged directly, in direct mechanical and/or electrical contact, on the other layer or the other element. It may moreover also mean that the one layer or the one element is arranged indirectly on or over the other layer or the other element. In that case, further layers and/or elements may then be arranged between the one layer and the other or between the one element and the other.

The statement that a layer or an element is arranged "between" two other layers or elements may here and hereinafter mean that the one layer or the one element is arranged directly in direct mechanical and/or electrical contact or in indirect contact with one of the two other layers or elements and in direct mechanical and/or electrical contact or in indirect contact with the other one of the two other layers or elements. In the case of indirect contact, further layers and/or elements may then be arranged between the one layer and at least one of the two other layers or between the one element and at least one of the two other elements.

The layers of the semiconductor layer sequence in each case comprise directions or planes of extension arranged parallel to one another, wherein the layers arranged one over the other of the semiconductor layer sequence are arranged on one another in a direction of arrangement. The direction of arrangement is in this case orthogonal to the directions of extension or to the planes of extension.

The first grating layer may in particular comprise grating lines which take the form of raised stripes with wells located therebetween forming the spaces. This may mean that the wells or spaces do not extend right through the first grating layer. Alternatively, the first grating layer may comprise separately arranged stripes separated spatially from one another by the spaces. The second grating layer may project through the first grating layer in the spaces between the stripes of the first grating layer as far as a functional layer located therebelow, as is explained in greater detail further below.

The transparent material of the second grating layer may preferably comprise a different and in particular unmatched crystal lattice structure from layers located therebelow, for instance the active layer and/or further functional layers, due to the non-epitaxial application. Furthermore, the transparent material may differ from the material system of the active layer or from the material system of the active layer and further functional layers. Non-epitaxial application methods, which may include chemical and physical application methods, are suitable for not continuing the crystal lattice structure of the layer or layers located therebelow, such that a second grating layer may be formed without crystal lattice matching. In this way, according to the method described herein and the optoelectronic semiconductor chip described herein, the second grating layer is identifiable after the application of epitaxially grown layers due to its unmatched crystal lattice structure.

The semiconductor layer sequence described herein or the semiconductor chip described herein particularly preferably is a laser diode, which in operation may generate coherent electromagnetic radiation brought about in particular by stimulated emission. The direction of emission is here preferably directed along and parallel to the directions of extension or the planes of extension of the layers of the semiconductor layer sequence and in particular along and parallel to the active layer. This means that the semiconductor chip particularly preferably takes the form of an "edge emitter," which may emit the electromagnetic radiation via at least one side face of the semiconductor layer sequence.

The semiconductor layer sequence may comprise as an active region in the active layer, for example, a pn-junction, a double heterostructure, a single quantum well structure (SQW structures) or a multiple quantum well structure (MQW structures). The term quantum well structure includes in particular any structure in which charge carriers may undergo quantization of their energy states by inclusion ("confinement"). In particular, the term quantum well structure does not provide any indication of the dimensionality of the quantization. It thus encompasses inter alia quantum troughs, quantum wires and quantum dots and any combination of these structures. In addition to the active layer with the active region, the semiconductor layer sequence may comprise further functional layers and functional regions selected from p- and n-doped charge carrier transport layers, i.e., electron and hole transport layers, p-, n- and undoped confinement, cladding and waveguide layers, barrier layers, planarizing layers, buffer layers, protective layers and electrodes and combinations of the stated layers. The electrodes may in this case each comprise one or more metal layers comprising Ag, Au, Sn, Ti, Pt, Pd and/or Ni. Furthermore, additional layers, for instance buffer layers, barrier layers and/or protective layers, may also be arranged perpendicularly to the direction of arrangement of the semiconductor layer sequence, for example, around the semiconductor layer sequence, i.e., for instance on the side faces of the semiconductor layer sequence.

Preferably, the semiconductor layer sequence comprises an active layer, which comprises a quantum well structure in the active region and which is arranged between two waveguide layers in the form of "side wells," whereby a "separate confinement heterostructure" (SCH structure) is formed. The SCH structure allows separate optimization of charge carrier confinement and vertical guidance of the electromagnetic radiation generated along the plane of extension of the active layer. The SCH structure may preferably be arranged between at least two further waveguide and/or at least two cladding layers. The above-mentioned layers and optionally further layers of the semiconductor layer sequence may be arranged on a substrate. The provision in the above-described method step A of the active layer may, for example, also mean the provision of such a layer sequence or also a modification thereof.

Depending on the construction of the substrate, an electrode may also be arranged on the same substrate surface as the active layer between the substrate and the active layer. Alternatively, the electrode may also be arranged on a surface remote from the active layer. Viewed from the substrate, a further electrode is arranged over the active layer.

The semiconductor layer sequence may take the form of an epitaxial layer sequence, i.e., of an epitaxially grown semiconductor layer sequence. In this case, the semiconductor layer sequence may, for example, be based on AlGaAs. AlGaAs-based semiconductor chips and semi-conductor layer sequences in particular include those in which the epitaxially produced semiconductor layer sequence, which generally comprises a layer sequence of different individual layers, contains at least one individual layer which comprises a material from the III-V compound semiconductor material system $Al_xGa_{1-x}As$ with $0 \leq x \leq 1$. In particular, an active layer comprising an AlGaAs-based material may be suitable for emitting electromagnetic radiation with one or more spectral components in a red to infrared wavelength range. Moreover, such a material may comprise In and/or P in addition or as an alternative to the stated elements.

Moreover, the semiconductor layer sequence may alternatively or additionally be based on InGaAlN. InGaAlN-based semiconductor chips and semiconductor layer sequences in particular include those in which the epitaxially produced semiconductor layer sequence generally comprises a layer sequence of different individual layers, including at least one individual layer which comprises a material from the III-V compound semiconductor material system $In_xAl_yGa_{1-x-y}N$ with $0 \leq x \leq 1$, $0 \leq y \leq 1$ and $x+y \leq 1$. Semiconductor layer sequences which comprise at least one active layer based on InGaAlN may, for example, preferably emit electromagnetic radiation in an ultraviolet to green wavelength range.

Alternatively or in addition, the semiconductor layer sequence may also be based on InGaAlP, i.e., the semiconductor layer sequence may comprise different individual layers, of which at least one individual layer comprises a material from the III-V compound semiconductor material system $In_xAl_yGa_{1-x-y}P$ with $0 \leq x \leq 1$, $0 \leq y \leq 1$ and $x+y \leq 1$. Semiconductor layer sequences or semiconductor chips which comprise at least one active layer based on InGaAlP may, for example, preferably emit electromagnetic radiation with one or more spectral components in a green to red wavelength range.

Alternatively or in addition, the semiconductor layer sequence or the semiconductor chip may also comprise II-VI compound semiconductor material systems in addition to or instead of the III-V compound semiconductor material systems. A II-VI compound semiconductor material may comprise at least one element from the second main group, such as, for example, Be, Mg, Ca, Sr, and one element from the sixth main group, such as, for example, O, S, Se. In particular, a II-VI compound semiconductor material comprises a binary, ternary or quaternary compound, which comprises at least one element from the second main group and at least one element from the sixth main group. Such a binary, ternary or quaternary compound may moreover comprise, for example, one or more dopants and additional constituents. The II-VI compound semiconductor materials, for example, include: ZnO, ZnMgO, CdS, ZnCdS, MgBeO.

The semiconductor layer sequence may additionally comprise a substrate on which the above-stated III-V or II-VI compound semiconductor material system is deposited. The substrate may in this case comprise a semiconductor material, for example, an above-mentioned compound semiconductor material system. In particular, the substrate may comprise GaP, GaN, SiC, Si and/or Ge or consist of such a material.

To allow operation of the semiconductor layer sequence or of the semiconductor chip in a lateral fundamental mode, layers of the semiconductor layer sequence arranged on at least one side of the active region may, for example, be patterned with a ridge and/or trapezoidal structure. Such configurations of the semiconductor layer sequence, known as ridge waveguides, rib waveguides, ridge structures, trapezoidal structures or tapered structures, are known and not further explained.

To allow operation of the semiconductor layer sequence or of the semiconductor chip in a selected longitudinal mode, the first and second grating layers may allow distributed feedback of the electromagnetic radiation generated in the active region and thus form a laser resonator or a part thereof. In this case, the first and second grating layers may be arranged directly over the active region or offset longitudinally thereto, but in the resonator region, whereby in the first instance a distributed feedback structure (DFB structure) and in the second instance a distributed Bragg reflector structure (DBR structure) may be formed. The basic mode of operation and the basic structure of DFB and DBR structures are known and not further explained.

In particular, the second grating layer may exhibit a lower refractive index than the first grating layer. This allows a spatial grating with a periodically varying refractive index in the direction of emission, which allows the distributed feedback or Bragg reflection typical of DFB and DBR structures. The wavelength of the electromagnetic radiation generated in the active region is fixed by the grating, i.e., the first and second grating layers, namely by constructive interference of the wave fed back at the grating. The period of the grating, i.e., the distance between one stripe of the first grating layer and an adjacent stripe, may be selected such that preferably that wavelength oscillates in the resonator which corresponds in the grating material to twice the period of the grating. The thickness of the further layers arranged between the active layer and the first and second grating layers, such as for instance waveguide and/or cladding layers, is selected to allow a sufficient degree of overlap of the mode, guided in the waveguide region, of the generated electromagnetic radiation with the first grating layer.

In known DFB and DBR laser structure a grating structure is produced by epitaxial deposition of the layers forming the grating. To this end, a material with a specific refractive index is produced in stripe-form, a material with a different refractive index thereafter being grown epitaxially over a large area thereof. This overgrowth process is technically possible, for example, in the InGaAsP/InP material system, though complex and expensive. However, in aluminum-containing material systems such as for instance AlGaAs/GaAs material systems such epitaxial overgrowth is technically possible only at extremely high cost or is not possible at all due to the high oxidation capacity of the aluminum. Therefore the technical approaches based, for example, on the InGaAsP/InP material system have not been able to gain acceptance in particular in the AlGaAs/GaAs material system. As an alternative, the desired spectral characteristics may be achieved by surface gratings, but such solutions are not really commercially acceptable due to the high optical losses that occur therewith.

In the case of the semiconductor chip described herein and the method described herein, the second grating layer is applied in method step C by a non-epitaxial application method, preferably by a physical application method, in particular by evaporation or sputtering. This allows the production of a DFB- or DBR-equivalent structure over the active layer of the semiconductor layer sequence, without the known and technically complex or barely possible epitaxial overgrowth step having to be performed. To this end, after formation of the stripes in the first grating layer, i.e., after the definition of a periodic grating, instead of epitaxial overgrowth the second grating layer is applied extensively and in an unpatterned manner to the stripes of the first grating layer and the spaces between them by evaporation or sputtering. A guided mode of the waveguide structure comprises a slightly different propagation constant in regions with and without stripes of the first grating layer due to the difference in refractive index between the first and second grating layers, which propagation constant may also be described by an effective refractive index. By suitable dimensioning of the pulse-duty factor, i.e., the ratio of the stripe width to the grating period, and the layer thicknesses of the first and second grating layers, it is possible to establish an effective refractive index difference of sufficient magnitude as a result of the different grating regions, namely the lines, i.e., the stripes or grating lines of the first grating layer, and the spaces, i.e., the spaces between the stripes of the first grating layer covered and filled with the second grating layer. This results in distributed coupling of forward- and backward-running electromagnetic waves in the resonator of the semiconductor chip. The strength of this coupling is proportional to the effective refractive index difference.

The transparent material of the second grating layer may in particular also form an electrical contact with the layer therebelow. To this end, the transparent material may particularly preferably be an electrically conductive transparent material. Furthermore, the transparent material may have a lower refractive index than the layer therebelow.

The second grating layer may have a refractive index which is less than or equal to 2.5. The refractive index of the second grating layer is particularly preferably less than or equal to 2. The lower the refractive index of the second grating layer in comparison to the first grating layer, the greater the difference in the effective refractive index of the lines and spaces, i.e., of the regions with the stripes of the first grating layer and the regions with the spaces. It may be possible that, by using a suitable transparent material in the second grating layer, a higher refractive index difference may be achieved relative to the first grating layer than is possible in the case of epitaxially overgrown gratings in known DFB or DBR lasers, since the epitaxial overgrowth layer typically comprises a refractive index which lies relatively close to the refractive index of the overgrown grating layer. It may additionally be possible for the cladding and/or waveguide layers arranged between the active layer and the first or second grating layer to be thinner than in the case of conventional DFB or DBR lasers with epitaxially overgrown gratings. Furthermore, the electromagnetic radiation generated in the active region may have a very small penetration depth in the second grating layer due to the elevated refractive index difference, whereby optical losses may be kept small by absorption in the second grating layer.

The transparent material may in particular comprise a transparent conductive oxide (TCO), as described, or consist of one. The TCO comprises a transparent, electrically conductive material, which comprises a metal oxide such as, for example, zinc oxide, tin oxide, cadmium oxide, titanium oxide, indium oxide or indium-tin oxide (ITO). In addition to binary metal-oxygen compounds, such as, for example, ZnO, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. It may additionally be possible for the TCOs not necessarily to correspond to a stoichiometric composition and they may also be p- or n-doped. The second grating layer particularly preferably comprises zinc oxide and/or ITO, due to ease of application and ready processability. The refractive index of the second grating layer with one or more TCOs as transparent material may in this case be less than 2 and, for example, amount to approximately 1.6.

The first grating layer may comprise a semiconductor material consisting of the material system of the active layer and/or the further layers such as for instance waveguide and/or cladding layers. To ensure good electrical connection of the first and second grating layers to the active layer, the first grating layer may also take the form of a contact layer. To this end, the first grating layer may, for example, exhibit a sufficiently high doping. In the AlGaAs material system the first grating layer may, for example, comprise GaAs.

To produce the first grating layer, the above-stated method step A or the above-stated method step B may comprise a further sub-step B1 and the method step B may comprise further sub-steps B2 and B3, the sub-steps involving:

B1) extensive application of the first grating layer,
B2) application of a mask layer with a plurality of stripes extending perpendicularly to the direction of emission of the active region and spaces located therebetween and
B3) wet-chemical etching of the first grating layer in the regions of the spaces in the mask layer.

The sub-step B1 may, for example, be performed by epitaxial growth on the active layer provided in method step A, wherein, as described above, in method step A the active layer may be provided with additional waveguide and/or cladding layers. The sub-step B1 is thus preferably carried out together with method step A in a single epitaxial step. In method step B2 the mask layer may be produced by extensive application of a suitable material and subsequent patterning in a lithographic step. In method step B3 the first grating layer may be etched only partially in the spaces in the mask layer, such that wells may be formed as spaces in the first grating layer. As an alternative, the first grating layer may be etched right through in the spaces in the mask layer, such that the stripes of the first grating layer are separated spatially from one another by the etched spaces.

The height of the first grating layer may be greater than or equal to 20 nanometers, preferably greater than or equal to 50 nanometers and particularly preferably greater than or equal to 80 nanometers. The greater the height of the first grating layer and in particular the higher the stripes and the spaces located therebetween, the greater is also the resultant effective refractive index difference between the grating regions and the greater is also the achievable coupling coefficient of the laser resonator produced in this way. It is in particular possible as a result of the first and second grating layers described herein to achieve a coupling coefficient of greater than or equal to 10/cm, preferably greater than or equal to 20/cm and particularly preferably of greater than or equal to 30/cm.

In a further method step D an electrode layer may be applied to the second grating layer, which electrode layer comprises one of the materials mentioned further above.

Furthermore, an unpatterned contact layer applied over a large area may be arranged between the active layer and the first grating layer. The contact layer may in this case comprise an epitaxially grown semiconductor material. As a result of the additional contact layer, it may be possible for the electrical connection between the first or the second grating layers and the layers therebelow, in particular the active layer, to be improved. In particular, the contact layer may make possible an extensive, uniform electrical connection. The first grating layer and the contact layer may here comprise the same material.

Furthermore, an interlayer may be arranged between the first grating layer and the contact layer, which interlayer is or has been patterned in stripes like the first grating layer. The interlayer may, for example, take the form of an etch stop layer, which simplifies production of the first grating layer on the contact layer. To this end, in the case of a first grating layer of GaAs, the interlayer may comprise or consist, for example, of a P-containing material, for instance preferably InGaP and/or AlGaP. The height of the interlayer may in this case fall within the range of values stated in connection with the first grating layer.

The first grating layer and the second grating layer with a transparent material as described above, in particular a TCO, may have a marked influence on the mode profile of the electromagnetic radiation generated in the active region, wherein a comparatively high coupling coefficient is possible, as with known laser structures. In particular, a DFB or DBR laser semiconductor chip may be made possible which does not comprise any epitaxially overgrown grating structure.

Further advantages and developments are revealed by the examples described below in conjunction with FIGS. 1A to 5.

In the examples and drawings, identical or identically acting constituents may in each case be provided with the same reference numerals. The elements illustrated and their size ratios to one another should not in principle be regarded as being to scale, but rather individual elements, such as, for example, layers, components, structural elements and zones, may have been made exaggeratedly thick or large to illustrate them better and/or to make them easier to understand.

FIGS. 1A to 1E show a method of producing an optoelectronic semiconductor chip 100 according to one example.

In a first method step A according to FIG. 1A an active layer 4 is provided. In particular, to this end a semiconductor layer sequence with a plurality of layers is provided, which comprises an active layer 4. The active layer 4 comprises an active region 11, which is suitable for emitting electromagnetic radiation in the direction of emission labeled 99 when the optoelectronic semiconductor chip 100 is in operation. The direction of arrangement of the layers of the semiconductor layer sequence is perpendicular to the direction of emission 99 shown.

In the example, the semiconductor layer sequence comprises a substrate 1 of GaAs, on which an n-conductive cladding layer 2 of AlGaAs is arranged. An n-conductive waveguide layer 3 of AlGaAs, the approximately 7 nanometer-thick active layer 4 with a multiple quantum well structure with InGaAs and a p-conductive waveguide layer 5 of AlGaAs are arranged thereover. The active layer 4 and the waveguide layers 3 and 5 form an SCH structure described above in the general section. The active layer 4 is suitable for generating electromagnetic radiation with a wavelength of approximately 920 nanometers. A p-conductive cladding layer 6 of AlGaAs is arranged over the waveguide layer 5. The cladding layers 2 and 6 have an Al content of greater than or equal to approximately 20% and less than or equal to approximately 30% and a thickness of several hundred nanometers, for instance in the range from 400 to 1000 nanometers. The waveguide layers 3 and 5 have an Al content of greater than or equal to approximately 5% and less than or equal to approximately 15% and a thickness of several tens of nanometers, for instance in the range from approximately 50 to 100 nanometers.

The substrate 1 may here be a growth substrate, on which the functional layers 2 to 6 are grown epitaxially. Alternatively, the semiconductor layer sequence may be produced by thin-film technology. This means that the functional layers 2 to 6 are grown on a growth substrate and then transferred to a carrier substrate, which then forms the substrate 1 of the semi-conductor layer sequence shown in FIG. 1A. Depending on the growth method, the n-conductive layers or alternatively also the p-conductive layers may face the substrate 1, as shown.

As an alternative to the layers and materials shown, semiconductor layer sequences with features and in particular an active layer according to the general section of the description may also be provided. The following description should not therefore be understood as limited to the stated materials and combinations.

Figure 1C:
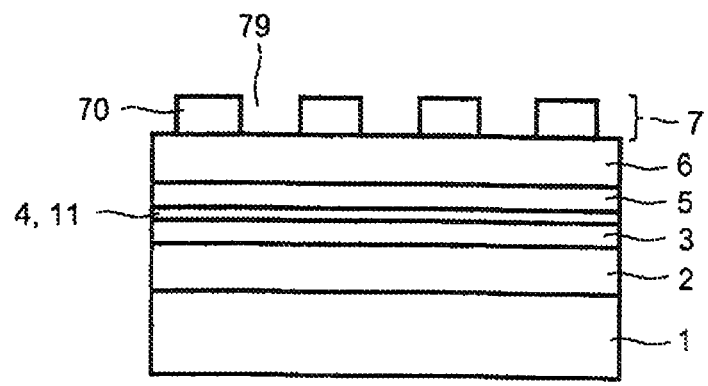

In a further method step B a first grating layer 7 is produced, with stripes 70 extending perpendicularly to the direction of emission 99 and spaces 79 located therebetween. To this end, in a sub-step B1 according to FIG. 1B the first grating layer 7 is epitaxially grown extensively and without patterning on the cladding layer 6. The sub-step B1 is here preferably performed together with the epitaxial development of the functional layers 2 to 6 in a single epitaxial step. In the example shown, the first grating layer 7 is made of p-doped GaAs and at the same time takes the form of a contact layer. By a lithographic and a subsequent wet chemical etching step (not shown), in further sub-steps B2 and B3 a grating pattern with grating lines is applied to the first grating layer 7 in the form of stripes 70 extending perpendicularly to the direction of emission 99, which stripes are separated from one another by the spaces 79 (FIG. 1C). In the direction of emission 99 the stripes 70 and spaces 79 form a periodic sequence of regions with the material of the first grating layer 7 and regions free of the material of the first grating layer 7. The dimensions of the stripes 70 and spaces 79 and the length of the region with the stripes 70 and the spaces 79, i.e., the length of the grating region, are selected from standpoints known to those skilled in the art in terms of DFB and DBR lasers and depend on the desired characteristics of the emitted electromagnetic radiation. The first grating layer 7 is here etched right through in the example shown, such that the spaces 79 separate the stripes 70 spatially from one another. As an alternative, the spaces 79 may also form wells in the first grating layer 7, which are produced in that the first grating layer 7 is not etched right through (not shown). By complete separation of the stripes 70 from one another and by spaces 79 which extend right through the first grating layer 7, it is possible to achieve a greater effective refractive index difference. If the spaces 79 take the form of wells, a more homogeneous current injection into the active layer 4 may be achieved, as is also explained further below in relation to the example of FIG. 2.

Figure 1D:
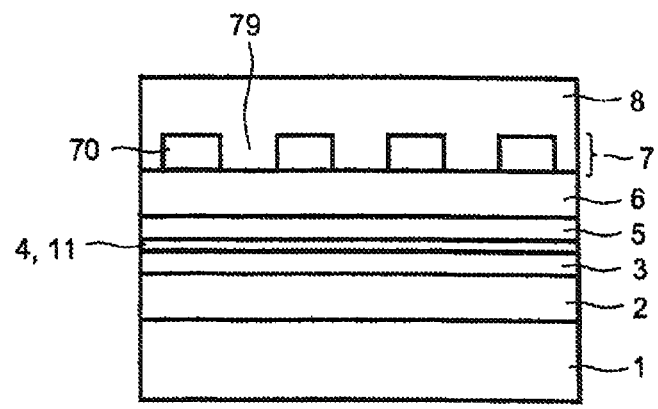

In a further sup-step C according to FIG. 1D, a second grating layer 8 is applied to the stripes 70 and the spaces 79 of the first grating layer 7 by vapor deposition or sputtering. Although the second grating layer 8 differs from an epitaxially grown overgrowth layer in terms of its crystal structure as a result of the physical application method, similar electrical characteristics may be achieved in terms of contact resistance to the cladding layer 6. Furthermore, the oxidation problem which would arise in the event of epitaxial overgrowth of the first grating layer 7 due to the Al content in the layers of the semiconductor layer sequence may be avoided. The second grating layer 8 covers the first grating layer 7 after application and thus has a height which is greater than the height of the first grating layer 7. The second grating layer 8 comprises a transparent material which is formed by a TCO, and in the example shown is made of zinc oxide or ITO with a refractive index of approximately 1.6.

Figure 1E:
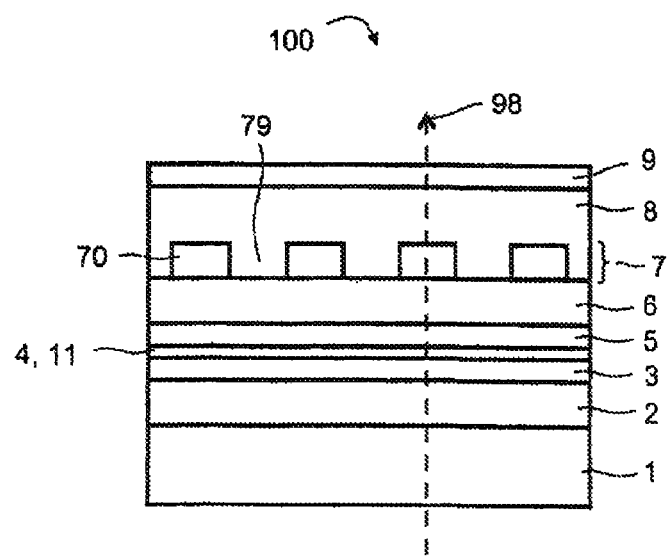

In a further method step D according to FIG. 1E an electrode layer 9 is applied on the second grating layer 8. A further electrode layer may be applied for bilateral electrical connection of the active layer 4 to the active region 11 on the surface of the substrate 1 remote from the active layer 4 (not shown). Alternatively, the further electrode layer may, for example, also contact the cladding layer 2 directly and be arranged on side of the substrate facing the active layer 4 (not shown).

The optoelectronic semiconductor chip 100 produced in this way according to FIG. 1E is constructed similarly to a known DFB laser, wherein the first and second grating layers 7, 8 are arranged directly over the active region 11 in the direction of arrangement. In this case, the low refractive index of the second grating layer 8 results in the optical mode produced in the active region 11 of the active layer 4 and capable of propagation in the semiconductor layer sequence being predominantly guided in the (optically) low-loss semiconductor material of the first grating layer 7 and only exhibiting a very slight overlap with the second grating layer.

Figure 4:
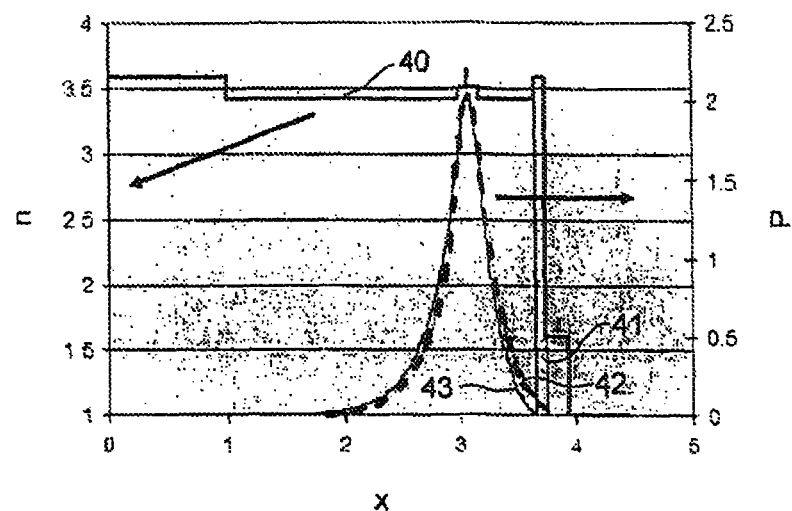
FIGS. 4 and 5 are graphs showing properties of optoelectronic semiconductor chips according to further examples.

This effect is clarified in the graph in FIG. 4. The distance x in micrometers from the surface of the substrate 1 remote from the active layer 4 in the direction of arrangement of the semiconductor layer sequence is plotted on the x axis, which corresponds to section axis 98 in FIG. 1E. In conjunction with the left-hand y axis, the curve 40 shows the refractive index of the functional layers of the semiconductor layer sequence. The refractive index of the substrate is approximately 3.6, that of the cladding layers approximately 3.4. The active layer with a refractive index of approximately 3.7 and the waveguide layers or SCH layers with a refractive index of approximately 3.5 are visible in the region of approximately 3 micrometers on the x axis. Adjacent thereto, the refractive index of the first grating layer 7 of approximately 3.6 is shown in the region designated 41. Adjacent thereto, the second grating layer 8 is visible, with a refractive index of approximately 1.6. In conjunction with the right-hand y axis, the curves 42 and 43 show in suitable units the power P of the optical mode in the semiconductor layer sequence. The curve 42 corresponds to the power of the optical mode in the region of the section axis 98 in FIG. 1E, i.e., in the region of a stripe 70 of the first grating layer 7, while the curve 43 shows the power of the optical mode in the region of a space 79. It should here be noted that for the curve 43 strictly speaking a curve 40 would have to be shown in which the refractive index shown in the region 41 corresponds to that of the second grating layer, i.e., approximately 1.6. A comparison of the curves 42 and 43 shows that the optical mode exhibits only slight overlap with the second grating layer.

This effect, i.e., that the optical mode exhibits barely any overlap with the second grating layer, is crucial to the efficiency of the optoelectronic semiconductor chip 100 shown, since the TCO of the second grating layer exhibits markedly greater optical losses than the semi-conductor material of the first grating layer 7, which does not, however, cause deterioration due to the slight overlap. Due to the periodic presence or absence of the material of the first grating layer 7, i.e., the periodic sequence of stripes 70 and spaces 79, a periodic variation of the effective mode refractive index thus forms in the longitudinal direction (direction of emission), which variation leads, as with known DFB lasers, to distributed feedback and the corresponding modification of the spectral characteristics of the electromagnetic radiation generated in the active region.

Figure 5:
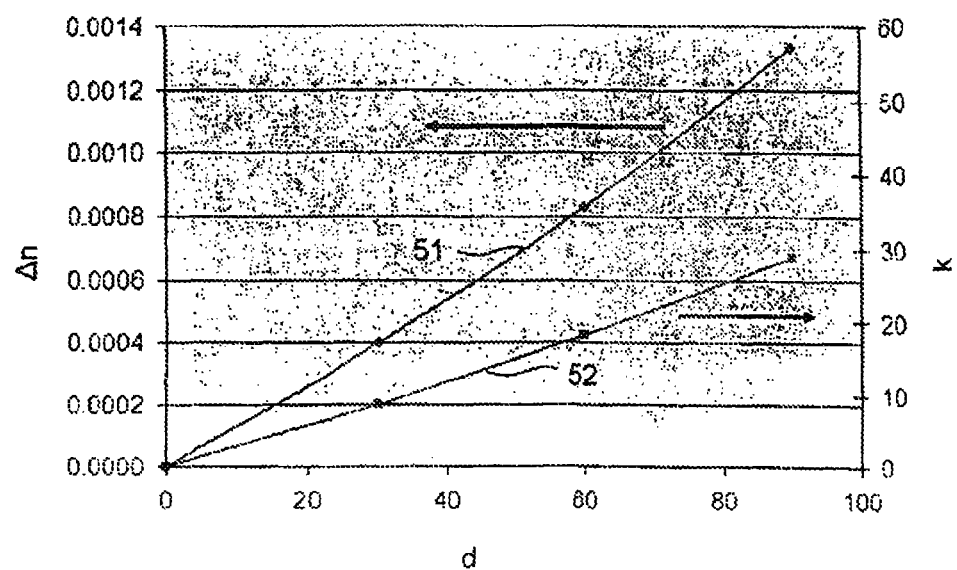

In this context FIG. 5 shows, as a function of the height d of the first grating layer 7 in nanometers, the refractive index difference Δn thereby achievable on the left-hand y axis in conjunction with the curve 51 and the resultant coupling coefficient k on the right-hand y axis in conjunction with the curve 52. In this case, a rectangular grating is assumed as the first grating layer 7 which has a pulse-duty ratio, i.e., a ratio of the width of the stripes 70 and the spaces 79, of 1:1. It is clear from FIG. 5 that coupling coefficients may be achieved which, with a k of approximately 30/cm, lie in the range of known DFB lasers. An additional possibility of variation of the coupling coefficient k arises through variation of the thickness of the upper cladding layer as viewed from the substrate.

Figure 2:
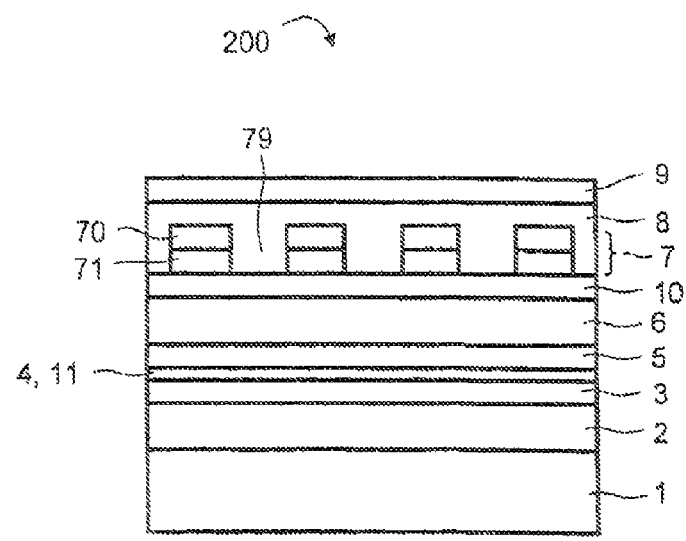
FIGS. 2 and 3 are schematic representations of optoelectronic semiconductor chips according to further examples.
Figure 3:
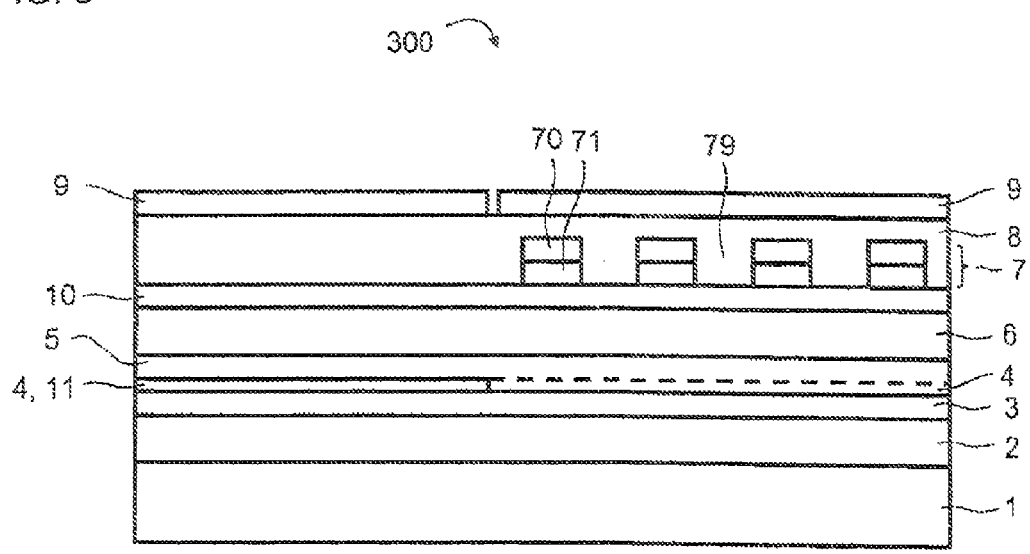

According to further examples, FIGS. 2 and 3 show modifications of the optoelectronic semiconductor chip 100 according to FIG. 1E.

The optoelectronic semiconductor chip 200 according to FIG. 2 comprises a contact layer 10 between the first grating layer 7 and the active layer 4 on the cladding layer 6, which contact layer 10 is unpatterned and applied extensively to the cladding layer 6. A homogeneous electrical connection of the first and second grating layers 7, 8 may be achieved in this way, irrespective of the materials and electrical characteristics thereof. It may be achieved in this way that the current injection into the active layer 4 is also as homogeneous as possible, in particular more homogeneous than in the previous example. While in the previous example current injection primarily takes place via the stripes 70 of the first grating layer 7 into the functional layers located therebelow, in the example of FIG. 2 electrical connection may proceed over the entire surface. In this way, the contact resistance between the grating layers 7, 8 and the functional layers located therebelow may be reduced. The contact layer 10 here has highly doped GaAs, like the first grating layer 7. Between the contact layer 10 and the first grating layer 7 an interlayer 71 is arranged in the regions of the stripes 70, which interlayer consists of AlGaP in the example shown. The interlayer 71 serves as an etch stop layer in the above-described method step B for producing the stripes 70 of the first grating layer 7.

In contrast to the examples of FIGS. 1E and 2, FIG. 3 shows an optoelectronic semiconductor chip 300 in a DBR-type configuration. The first grating layer 7 with the stripes 70 and the spaces 79 with the material of the second grating layer 8 are offset longitudinally relative to the active region 11 of the active layer 4. The active layer 4 may here also be removed in the region of the first grating layer 7, which is indicated by the dashed line.

The description made with reference to examples does not restrict this disclosure to these examples. Rather, the disclosure encompasses any novel feature and any combination of features, including in particular any combination of features in the appended claims, even if the feature or combination is not itself explicitly indicated in the claims or examples.

The invention claimed is:

1. An optoelectronic semiconductor chip having a semiconductor layer sequence with a plurality of layers arranged over one another, comprising:
    an active layer with an active region that emits electromagnetic radiation in an emission direction when in operation,
    an epitaxially grown first grating layer comprising separately arranged stripes spatially separated from one another on the active layer which, in an emission direction, has a plurality of stripes comprising grating lines extending perpendicularly to the emission direction with spaces arranged therebetween, and
    a second grating layer on the first grating layer which covers the stripes of the first grating layer and the spaces and which comprises a transparent material applied by non-epitaxial application.

2. The semiconductor chip according to claim 1, wherein the second grating layer has a lower refractive index than the first grating layer.

3. The semiconductor chip according to claim 1, wherein a refractive index of the second grating layer is less than or equal to 2.

4. The semiconductor chip according to claim 1, wherein the transparent material of the second grating layer comprises a transparent conductive oxide.

5. The semiconductor chip according to claim 1, wherein the second grating layer is applied by vapor deposition or sputtering.

6. The semiconductor chip according to claim 1, wherein the first grating layer is a contact layer.

7. The semiconductor chip according to claim 1, further comprising an unpatterned contact layer applied between the first grating layer and the active layer.

8. The semiconductor chip according to claim 1, wherein the first and second grating layers are arranged in a direction of arrangement of the semiconductor layer sequence over the active region.

9. The semiconductor chip according to claim 1, wherein the first and second grating layers are arranged offset longitudinally relative to the active region.

10. The semiconductor chip according to claim 1, further comprising an electrode arranged on the second grating layer.

11. The semiconductor chip according to claim 7, further comprising an interlayer arranged between the first grating layer and the unpatterned contact layer.

12. The semiconductor chip according to claim 11, wherein the interlayer is an etch stop layer.

13. A method of producing an optoelectronic semiconductor chip with a semiconductor layer sequence with a plurality of layers arranged one over the other, comprising:
    A) providing an active layer with an active region which emits electromagnetic radiation in an emission direction when in operation,
    B) applying an epitaxially grown first grating layer comprising separately arranged stripes spatially separated from one another on the active layer which, in an emission direction, has a plurality of stripes in the form of grating lines extending perpendicularly to the emission direction with spaces arranged therebetween, and C) applying a second grating layer on the first grating layer which covers the stripes of the first grating layer and the spaces and which comprises a transparent material applied by non-epitaxial application.

14. The method according to claim 13, wherein the transparent material comprises a transparent conductive oxide and is applied by vapor deposition or sputtering.

15. The method according to claim 13, wherein method step A or method step B comprises a farther sub-step B1 and method step B comprises further sub-steps B2 and B3, said sub-steps comprising:
   B1) application of the first grating layer;
   B2) application of a mask layer with a plurality of stripes extending perpendicularly to the direction of emission of the active region and spaces located therebetween; and
   B3) wet-chemical etching the first grating layer in regions of the spaces in the mask layer.

16. The method according to claim 14, wherein method step A or method stop B comprises a further sub-step B1 and method step B comprises further sub-steps B2 and B3, said sub-steps comprising:
   B1) application of the first grating layer;
   B2) application of a mask layer with a plurality of stripes extending perpendicularly to the direction of emission of the active region and spaces located therebetween; and
   B3) wet-chemical etching the first grating layer in regions of the spaces in the mask layer.

17. An optoelectronic semiconductor chip having a semiconductor layer sequence with a plurality of layers arranged over one another, comprising:
   an active layer with an active region that emits electromagnetic radiation in an emission direction when in operation,
   an epitaxially grown first grating layer comprising separately arranged stripes spatially separated from one another on the active layer which, in an emission direction, has a plurality of stripes comprising grating lines extending perpendicularly to the emission direction with spaces arranged therebetween, and
   a second grating layer on the first grating layer which covers the stripes of the first grating layer and the spaces and which comprises a transparent material applied by non-epitaxial application, and has a refractive index of less than 2.5.

* * * * *

UNITED STATES PATENT AND TRADEMARK OFFICE
CERTIFICATE OF CORRECTION

PATENT NO. : 8,536,603 B2
APPLICATION NO. : 13/123779
DATED : September 17, 2013
INVENTOR(S) : Illek et al.

It is certified that error appears in the above-identified patent and that said Letters Patent is hereby corrected as shown below:

In the Claims

<u>In Column 13</u>

In claim 15, line 9, please change "farther" to --further--.

Signed and Sealed this
Tenth Day of December, 2013

Margaret A. Focarino
*Commissioner for Patents of the United States Patent and Trademark Office*